(12) United States Patent
Ahn et al.

(10) Patent No.: US 7,268,035 B2
(45) Date of Patent: Sep. 11, 2007

(54) METHODS OF FORMING SEMICONDUCTOR CONSTRUCTIONS COMPRISING CERIUM OXIDE AND TITANIUM OXIDE

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/064,163

(22) Filed: Feb. 23, 2005

(65) Prior Publication Data

US 2005/0285103 A1 Dec. 29, 2005

Related U.S. Application Data

(62) Division of application No. 10/881,874, filed on Jun. 29, 2004.

(51) Int. Cl.
  *H01L 21/8242* (2006.01)
(52) U.S. Cl. .................. 438/240; 438/386; 438/393; 438/396; 257/E23.077; 257/E23.132; 257/E23.134
(58) Field of Classification Search ............... 438/785, 438/787, FOR. 403, 239, 240, 386, 393, 438/396, FOR. 220, FOR. 430; 257/E23.077, 257/E23.132, E23.134
See application file for complete search history.

(56) References Cited

U.S. PATENT DOCUMENTS

| 6,258,654 | B1 | 7/2001 | Gocho |
| 6,451,647 | B1 | 9/2002 | Yang et al. |
| 6,509,234 | B1 | 1/2003 | Krivokapic |
| 6,528,858 | B1 | 3/2003 | Yu et al. |
| 6,797,567 | B2 | 9/2004 | Chang |
| 6,812,514 | B1 | 11/2004 | Yang et al. |
| 6,815,297 | B1 | 11/2004 | Krivokapic |
| 6,858,514 | B2 | 2/2005 | Hsu et al. |
| 6,995,437 | B1 | 2/2006 | Kinoshita et al. |
| 2002/0195683 | A1 | 12/2002 | Kim et al. |
| 2003/0124792 | A1* | 7/2003 | Jeon et al. .................. 438/240 |
| 2004/0057193 | A1* | 3/2004 | Moon et al. ................. 361/313 |
| 2004/0183116 | A1* | 9/2004 | Cho et al. .................... 257/303 |
| 2004/0185613 | A1 | 9/2004 | Lin et al. |
| 2004/0235242 | A1 | 11/2004 | Basceri et al. |
| 2005/0035410 | A1 | 2/2005 | Yeo et al. |
| 2005/0224897 | A1* | 10/2005 | Chen et al. .................. 257/410 |

OTHER PUBLICATIONS

Osten, H. et al., "High-k Gate Dielectrics with Ultra-Low Leakage Current Based on Praseodymum Oxide", IEEE Apr. 2000, pp. 653-656.

(Continued)

*Primary Examiner*—Michelle Estrada
(74) *Attorney, Agent, or Firm*—Wells St. John P.S.

(57) ABSTRACT

The invention includes semiconductor constructions comprising dielectric materials which contain cerium oxide and titanium oxide. The dielectric materials can contain a homogeneous distribution of cerium oxide and titanium oxide, and/or can contain a laminate of cerium oxide and titanium oxide. The dielectric materials can be incorporated into any suitable semiconductor devices, including, for example, capacitor devices, transistor devices, and flash memory devices. The invention also includes methods of utilizing atomic layer deposition to form laminates of cerium oxide and titanium oxide.

5 Claims, 4 Drawing Sheets

OTHER PUBLICATIONS

Sneh, O. et al., "Thin Film Atomic Layer Deposition Equipment for Semiconductor Processing", Thin Solid Films 402 (2002), pp. 248-261.

McKee, R. et al., "Physical Structure and Inversion Charge at a Semiconductor Interface with a Crystalline Oxide", http://www.sciencemag.org/cgi/content/full/293/5529/468, reprinted Jul. 16, 2002, 9 pages.

McKee, R. et al., "Crystalline Oxides on Silicon: The First Five Monolayers", Physical Review Letters, vol. 81, No. 14, Oct. 5, 1998, pp. 3014-3017.

Wu, Y. et al., "Electrical Characteristics of High Quality $La_2O_3$ Gate Dielectric with Equivalent Oxide Thickness of 5 Å", IEEE vol. 21, No. 7, Jul. 2000, pp. 341-343.

Mölsä, H. et al., "Deposition of Cerium Dioxide Thin Films on Silicon Substrates by Atomic Layer Epitaxy", Mat. Res. Soc. Symp. Proc., vol. 335, 1994 Materials Research Society, pp. 341-350.

Wilk, G. et al., "High-k Gate Dielectrics: Current Status and Materials Properties Considerations", Jour. App. Phys., vol. 89, No. 10, May 15, 2001, pp. 5243-5275.

Nishikawa, Y. et al., "Electrical Properties of Single Crystalline $CeO_2$ High-k Dielectrics Directly Grown on Si (111)", Jpn. J. Appl. Phys., vol. 41, Part 1, No. 4B, Apr. 2002, pp. 2480-2483.

Kukli, K. et al., "Atomic Layer Deposition of Titanium Oxide from $TiI_4$ and $H_2O_2$", Chem. Vap. Deposition, vol. 6, No. 6, 2000, pp. 303-310.

Becht, M. et al., "Some Cerium β-Diketonate Derivatives as MOCVD Precursors", Chem. Mater., vol. 5, No. 1, 1993, pp. 137-144.

Zhang, H. et al., "Atomic Layer Deposition of High Dielectric Constant Nanolaminates", J. of the Electrochemical Soc., vol. 148, No. 4, 2001, pp. F63-F66.

\* cited by examiner

METHODS OF FORMING SEMICONDUCTOR CONSTRUCTIONS COMPRISING CERIUM OXIDE AND TITANIUM OXIDE

RELATED PATENT DATA

This patent resulted from a divisional application of U.S. patent application Ser. No. 10/881,874, which was filed Jun. 29, 2004.

TECHNICAL FIELD

The invention pertains to semiconductor constructions comprising cerium oxide and tantalum oxide, and pertains to methods of forming constructions comprising dielectric materials containing cerium oxide and titanium oxide.

BACKGROUND OF THE INVENTION

Dielectric materials have numerous applications for modern semiconductor devices. For instance, dielectric materials are utilized in field effect transistors to provide insulation between a transistor gate and a channel region, are utilized for inter-gate insulation and tunnel gate insulation in flash memory devices, and are utilized to provide insulation between electrodes in capacitor constructions.

Due to the diverse applications for dielectric materials, there is a continuing need to develop new dielectric materials.

SUMMARY OF THE INVENTION

In one aspect, the invention includes a semiconductor construction which comprises a dielectric material containing cerium oxide and titanium oxide. The dielectric material can be a homogeneous mixture of cerium oxide and titanium oxide. Alternatively, the dielectric material can be a laminate of cerium oxide and titanium oxide. The dielectric material can be utilized in any suitable semiconductor device construction, including, for example, capacitor constructions, transistor constructions, and flash memory device constructions (including, for example, nitrided read only memory (NROM) devices).

In another aspect, the invention encompasses a method of forming a semiconductor construction. A semiconductor substrate is provided, and a laminate dielectric material is atomic layer deposited onto the substrate, with the laminate comprising $CeO_2$ and $TiO_2$.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

One aspect of the present invention is a recognition that a dielectric material comprising a mixture of cerium oxide and titanium oxide can have application for various semiconductor devices. The dielectric material can comprise, consist essentially of, or consist of cerium oxide and titanium oxide, with the cerium oxide and titanium oxide being provided in any desired ratio. The dielectric constant of $TiO_2$ is about 80, whereas the dielectric constant of $CeO_2$ is about 52. Accordingly, a dielectric material comprising $TiO_2$ mixed with $CeO_2$ can be a high-k dielectric. The dielectric constant of such high-k material can be tailored to be between 52 and 80 by adjusting the ratio of $TiO_2$ relative to $CeO_2$. Also, other properties of the dielectric material can be tailored by adjusting the ratio of titanium oxide and cerium oxide, including, for example, leakage properties of the dielectric material.

Dielectric materials comprising, consisting essentially of, or consisting of cerium oxide and titanium oxide can be formed to be homogeneous mixtures of cerium oxide and titanium oxide, or in other aspects of the invention can be formed to be laminate structures comprising alternating layers of $TiO_2$ and $CeO_2$. The laminates can be formed by, for example, atomic layer deposition (ALD), and can be formed to be very thin (in some aspects less than 50 Å, or even less than 20 Å), and accordingly can be referred to as nanolaminate structures.

Various methods are known for atomic layer deposition of cerium oxide and titanium oxide, and any suitable method can be chosen. For instance, cerium oxide can be deposited utilizing the precursor $Ce(thd)_4$ (where thd is 2,2,6,6-tetramethyl-3,5-heptanedione) and ozone (as described in Heini Molsa et al., "Deposition of Cerium Oxide Thin Films on Silicon Substrates By Atomic Layer Epitaxy", Mat. Res. Soc. Symp. Proc. Vol. 335, p. 341-350, 1994; which is incorporated herein by reference). Titanium oxide can be deposited by a method described in Kaupo Kukli et al., "Atomic Layer Deposition of Titanium Oxide from $TiI_4$ and $H_2O_2$", Chem. Vap. Deposition, 2000, 6, No. 6, p. 303-310, which is incorporated herein by reference. Both the titanium oxide and the cerium oxide can be deposited at temperatures less than 425° C., with a typical substrate temperature for deposition of cerium oxide being from about 375° C. to about 425° C., and a typical substrate temperature for deposition of titanium oxide being from about 250° C. to about 425° C. The above-described ALD methods are but exemplary suitable methods for deposition of cerium oxide and titanium oxide, and it is to be understood that other methods can be used in various aspects of the invention, including, for example, chemical vapor deposition (CVD).

Among the advantages of ALD is that such can be conducted with saturation of all reaction steps, to make the growth self-limiting. This can bring large area uniformity and conformality to a deposition process under diverse conditions, including, for example, planar substrates, substrates having deep trenches, and extreme cases of porous silicon and high surface area silica and alumina powders. Additionally, ALD can allow the thickness of a deposited film to be controlled and tailored by the tailoring of the number of growth cycles utilized during an ALD process.

Figure 1:
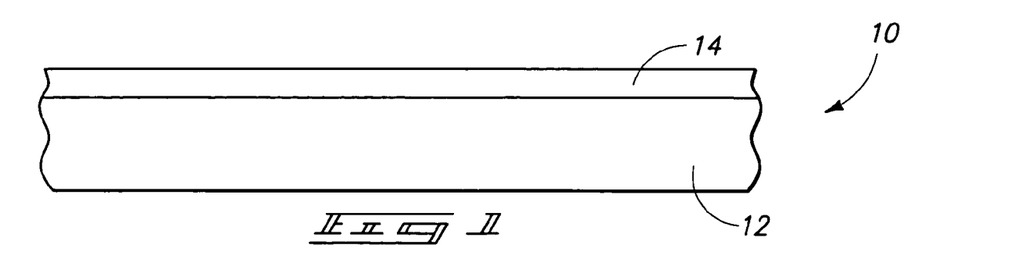
FIG. 1 is a diagrammatic, cross-sectional view of a semiconductor construction illustrating a first embodiment aspect of the present invention.

Exemplary structures which can be formed in accordance with various aspects of the invention are described with reference to FIGS. 1-7. Referring initially to FIG. 1, a structure 10 comprises a substrate 12 having a dielectric material 14 of the present invention thereover. Substrate 12 can comprise any suitable material or combination of materials, and in particular aspects will comprise a semiconductor substrate. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Dielectric composition 14 comprises a mixture of cerium oxide and titanium oxide, and in the shown aspect of FIG. 1 comprises a homogeneous mixture of the titanium oxide and cerium oxide. Such homogeneous mixture can be formed by, for example, chemical vapor deposition utilizing precursors containing cerium and titanium in combination with appropriate oxidants, such as, for example, one or both hydrogen peroxide and ozone. Dielectric material 14 can be formed to any suitable thickness, and in particular aspects will be formed to a thickness of greater than or equal to 20 Å, and in further aspects can be formed to a thickness of greater than or equal to 50 Å.

The dielectric material 14 can predominately comprise cerium oxide (i.e. comprise more than 50% cerium oxide by weight) in some aspects of the invention, and in other aspects can predominately comprise titanium oxide.

The dielectric material 14 can be incorporated into any suitable semiconductor device, including, for example, capacitor devices, transistor devices, flash memory devices, etc., with exemplary devices being described below with reference to FIGS. 5-7.

Figure 2:
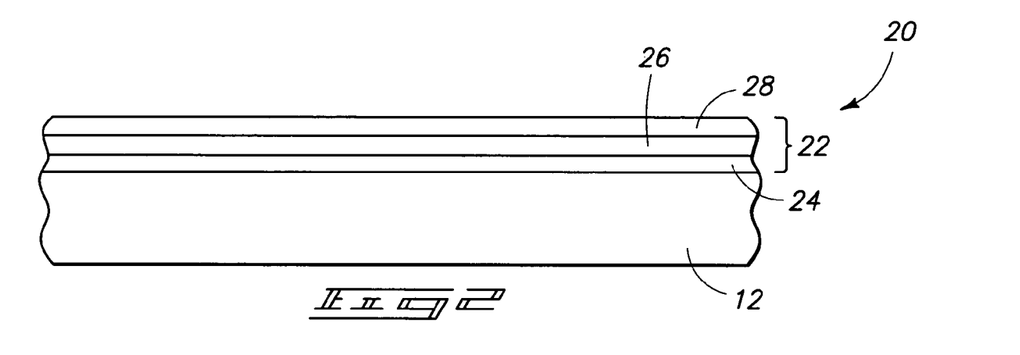
FIG. 2 is a diagrammatic, cross-sectional view of a semiconductor construction illustrating a second embodiment aspect of the present invention.

Referring next to FIG. 2, such shows a construction 20 illustrating another embodiment of the invention. Construction 20 comprises the substrate 12 described above with reference to FIG. 1. Construction 20 also includes a dielectric material 22 comprising a laminate of three separate dielectric layers 24, 26 and 28. Each of layers 24, 26 and 28 can comprise, consist essentially of, or consist of titanium oxide or cerium oxide. For instance, layers 24 and 28 can each consist essentially of or consist of cerium oxide, while layer 26 consists essentially of or consists of titanium oxide. Alternatively, each of layers 24 and 28 can consist essentially of or consist of titanium oxide, while layer 26 consists essentially of or consists of cerium oxide. If layers 24 and 28 consist essentially of or consist of cerium oxide while layer 26 consists essentially of or consists of titanium oxide, the laminate 22 will predominately comprise cerium oxide. In alternative embodiments where layers 24 and 28 consist essentially of or consist of titanium oxide while layer 26 consists essentially of or consists of cerium oxide, laminate 22 will predominately comprise titanium oxide.

In some aspects of the invention, layers 24 and 28 can be considered to comprise a first composition, and layer 26 can be considered to comprise a second composition different from the first composition. One of the first and second compositions is predominately titanium oxide, and the other is predominately cerium oxide.

Layers 24, 26 and 28 can be considered to be a plurality of separate layers, with layers 24 and 28 being a pair of layers comprising a first composition, and which are otherwise adjacent except for the layer 26 of the second composition which is between them.

The layers 24, 26 and 28 can each be deposited utilizing atomic layer deposition. The layers can have any suitable thickness, and in particular aspects the individual layers will be atomic layer deposited to thicknesses of, for example, from about 10 Å to about 50 Å.

In the shown aspect of the invention, the layer 26 comprising the second composition is deposited over and in direct physical contact with the layer 24 comprising the first composition. As discussed above, one of the layers 26 and 24 can consist essentially of, or consist of cerium oxide, and the other can consist essentially of or consist of titanium oxide. It is to be understood that the invention encompasses other aspects (not shown) in which dielectric materials other than cerium oxide and titanium oxide are incorporated into the laminate structure 22. For instance, an intervening dielectric material can be provided between layers 26 and 28 so that a layer consisting essentially of or consisting of cerium oxide is spaced from a layer consisting essentially of or consisting of titanium oxide by an intervening dielectric material which does not contain either cerium oxide or titanium oxide. Such intervening dielectric material can comprise any suitable composition (such as, for example, silicon dioxide, silicon nitride, high k materials, etc.), and can be provided to, for example, adjust leakage properties of laminate 22 and/or adjust a dielectric constant of the laminate 22.

Although laminate 22 is shown to contain only three separate layers (24, 26 and 28), it is to be understood that laminate 22 can be formed to comprise any suitable number of separate layers. Laminate 22 can be described as comprising two or more separate layers, with at least two of the layers differing in composition relative to one another. At least one of layers of the laminate will typically predominately comprise cerium oxide, and at least one other layer of the laminate with typically predominately comprise titanium oxide.

Figure 3:
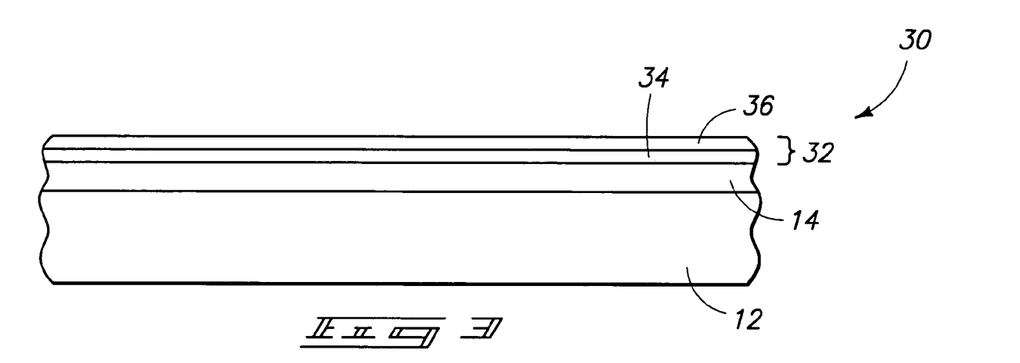
FIG. 3 is a diagrammatic, cross-sectional view of a semiconductor construction illustrating a third embodiment aspect of the present invention.

Referring next to FIG. 3, a construction 30 is illustrated showing another aspect of the invention. Construction 30 comprises the substrate 12 described previously, and comprises the homogeneous dielectric material 14 described above with reference to FIG. 1. Construction 30 also comprises a laminate 32 over homogeneous material 14, with such laminate comprising a first layer 34 and a second layer 36. One of layers 34 and 36 can predominately comprise, consist essentially of, or consist of cerium oxide, and the other can predominately comprise, consist essentially of, or consist of titanium oxide. The layers 34 and 36 can be formed by any suitable methods, including, for example, ALD methods of the type described above with reference to FIG. 2.

In the shown aspect of the invention, homogeneous layer 14 is thicker than either of the laminate layers 34 and 36, and is approximately the same thickness as the combined thickness of laminate layers 34 and 36. It is to be understood, however, that the invention encompasses other aspects in which multiple laminate layers are utilized to form a combined thickness of the laminate layers thicker than homogeneous material 14, as well as aspects in which homogeneous material 14 is formed to be thicker than the combined thickness of the laminate materials provided thereover.

An advantage to utilizing a homogeneous material 14 in combination with laminate layers 34 and 36 is that such can enable tailoring of dielectric properties of the cerium oxide/titanium oxide material comprised by the combined layers 14, 34 and 36 beyond the tailoring which can be achieved utilizing a homogeneous layer alone or utilizing the laminate layers alone.

Figure 4:
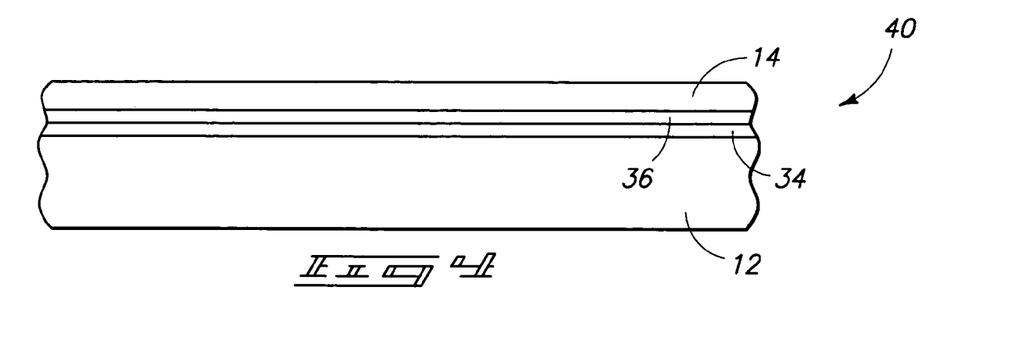
FIG. 4 is a diagrammatic, cross-sectional view of a semiconductor construction illustrating a fourth embodiment aspect of the present invention.

FIG. 4 shows another construction 40 which illustrates yet another aspect of the invention. Construction 40 comprises the substrate 12, homogeneous material 14, and laminate materials 34 and 36 described above with reference to FIG. 3. However, in the embodiment of FIG. 4 the laminate materials 34 and 36 are provided directly over substrate 12, and homogeneous material 14 is provided over the laminate materials; which is the opposite ordering as the FIG. 3 embodiment. The shown embodiment of FIG. 4 can be formed by, for example, atomic layer deposition of laminate layers 34 and 36, followed by chemical vapor deposition of homogeneous material 14.

The various dielectric structures of FIGS. 1-4 can be incorporated into numerous circuit devices. Exemplary devices are described with reference to FIGS. 5-7. Referring initially to FIG. 5, a construction 50 is illustrated to comprise a capacitor structure 52 over a semiconductor substrate 12. Structure 52 comprises a pair of capacitor electrodes 54 and 56 which are spaced from one another by a dielectric material 58.

Capacitor electrodes 54 and 56 can comprise any suitable conductive material or combination of conductive materials, including, for example, metals (in either or both of elemental form and the form of metal compounds) and/or conductively-doped silicon. In particular aspects, capacitor 52 will be a metal-insulator-metal capacitor.

Dielectric material 58 can comprise a homogeneous mixture of cerium oxide and titanium oxide, and/or a laminate of cerium oxide and titanium oxide. Accordingly, dielectric material 58 can comprise, for example, any of the dielectric material structures described above with reference to FIGS. 1-4.

Capacitor electrode 54 is diagrammatically illustrated as being electrically connected to adjacent circuitry 60. Such adjacent circuitry can comprise, for example, a transistor structure. The combination of a capacitor 52 with the transistor structure can form a unit cell with of a dynamic random access memory (DRAM), and accordingly capacitor 52 can be incorporated into a DRAM array. Capacitor 52 can also be incorporated into other types of electronic circuitry. For instance, circuitry 60 can correspond to an analog circuit, a radio frequency circuit, a mixed signal integrated circuit, etc. Accordingly, capacitor 52 can be incorporated into an analog circuit, a radio frequency circuit, a mixed signal integrated circuit, etc.

The dielectric material 58 can comprise, consist essentially of, or consist of cerium oxide and titanium oxide. In particular aspects, dielectric material 58 will consist essentially of or consist of cerium oxide and titanium oxide. In other aspects, dielectric material 58 will comprise a component consisting essentially of or consisting of titanium oxide in combination with cerium oxide, and another component which does not contain titanium oxide and cerium oxide. Such other component can be any suitable dielectric material for inclusion within the dielectric 58 of the capacitor construction 52. The utilization of capacitor dielectrics which include either a homogeneous mixture of titanium oxide and cerium oxide and/or a laminate mixture of titanium oxide and cerium oxide, together with another component which is not a mixture of cerium oxide and titanium oxide (either homogeneous or laminate) can enable dielectric properties of the dielectric 58 to be tailored in ways which cannot be achieved utilizing mixtures of titanium oxide and cerium oxide alone. The other dielectric materials which can be utilized in addition to the mixtures of cerium oxide and titanium oxide can comprise, consist essentially of, or consist of, for example, silicon dioxide, silicon nitride, or high-k dielectric materials.

An exemplary method of forming capacitor construction 52 is to provide the semiconductor substrate 12, form the first electrode 54 over the substrate, form a combination of titanium oxide and cerium oxide over the first electrode as the dielectric material 58 (the combination can be a homogenous combination and/or a laminate), and then to form the second electrode 56 over the dielectric material.

Figure 6:
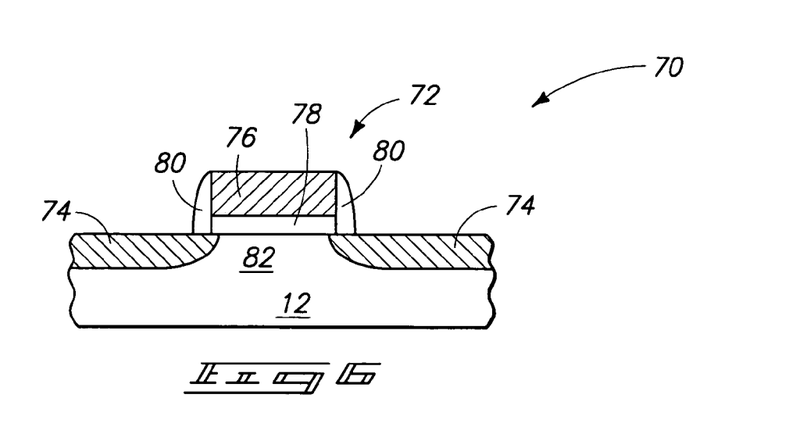
FIG. 6 is a diagrammatic, cross-sectional view of a semiconductor construction illustrating a field effect transistor formed in accordance with an aspect of the present invention.

Referring next to FIG. 6, a construction 70 illustrates a transistor device which can be formed in accordance with an aspect of the present invention. Specifically, construction 70 comprises a substrate 12, and a transistor device 72 supported by such substrate. Transistor device 72 comprises a pair of source/drain regions 74 extending within substrate 12, and corresponding to conductively-doped diffusion regions. Transistor device 72 further comprises a gate 76 formed over substrate 12, and comprises a dielectric material 78 between gate 76 and substrate 12. Additionally, the transistor structure comprises sidewall spacers 80 along sidewalls of gate 76.

Source/drain regions 74 are spaced from one another by a channel region 82 which is beneath gate 76. Dielectric material 78 is between the gate and the channel region. Dielectric material 78 can comprise any of the dielectric material constructions described previously with reference to FIGS. 1-4. Accordingly, dielectric material 78 can comprise, consist essentially of, or consist of a mixture of cerium oxide and titanium oxide (either a homogeneous mixture, a laminate mixture, or a combination of a homogeneous mixture and a laminate mixture). Alternatively, dielectric 78 can comprise a mixture of cerium oxide and titanium oxide together with another dielectric which is not a mixture of cerium oxide and titanium oxide. Such other dielectric can correspond to any suitable dielectric, including, for example, silicon dioxide, silicon nitride, or so-called high-k dielectric material. The utilization of the mixture of cerium oxide and titanium oxide can allow the dielectric properties of dielectric material 78 to be tailored, and the inclusion of a dielectric material in addition to the mixture can further enable tailoring of the properties of dielectric material 78.

An exemplary method of forming transistor device 72 is to provide the semiconductor substrate 12, form the transistor device channel region 82 within the substrate, by, for example, appropriate doping of the substrate, form a combination of titanium oxide and cerium oxide over the channel region as the dielectric material 78 (the combination can be a homogenous combination and/or a laminate), and then to form gate 76 over the dielectric material.

Figure 7:
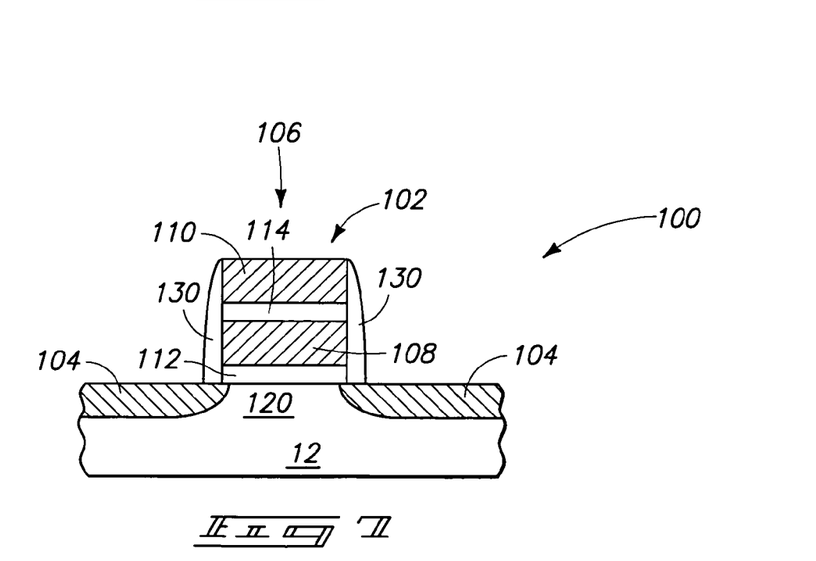
FIG. 7 is a diagrammatic, cross-sectional view of a semiconductor construction illustrating a flash memory device formed in accordance with an aspect of the present invention.

Referring next to FIG. 7, such shows a construction 100 comprising a read only memory (ROM) device (such as a flash memory device) 102 which can be formed in accordance with an exemplary aspect of the present invention. The read only memory device 102 is supported by a substrate 12. Read only memory device 102 comprises a pair of source/drain regions 104 extending within substrate 12. Source/drain regions 104 correspond to conductively-doped diffusion regions. Device 102 further comprises a gate stack 106 over the substrate. Gate stack 106 comprises a floating gate 108 and a control gate 110. Floating gate 108 is separated from substrate 12 by a dielectric material 112, and floating gate 108 is separated from control gate 110 by another dielectric material 114. Dielectric material 112 can be referred to as a tunnel dielectric (or tunnel gate insulator), and dielectric material 114 can be referred to as an inter-gate dielectric.

A channel region 120 extends between source/drain regions 104, and floating gate 108 is separated from such channel region by the dielectric material 112.

Sidewall spacers 130 are shown adjacent gate stack 106, and along sidewalls of the gate stack. Sidewall spacers 130 can comprise any suitable dielectric material.

Either or both of the dielectric materials 112 and 114 of the device 102 can comprise a dielectric construction of the type described with reference to FIGS. 1-4, and accordingly either or both of the dielectric materials 112 and 114 can comprise, consist essentially of, or consist of a mixture of cerium oxide and titanium oxide (either a homogeneous mixture, or a laminate mixture). Such mixture can be utilized alone as one or both of the dielectrics 112 and 114, or can be utilized in combination with one or more other dielectric materials. For instance, either or both of the dielectric materials 112 or 114 can comprise a mixture of cerium oxide and titanium oxide, together with another dielectric which does not contain cerium oxide or titanium oxide. As discussed previously, an advantage of utilizing a mixture of cerium oxide and titanium oxide with another dielectric which does not contain cerium oxide or titanium oxide can be that the dielectric properties of the dielectric material can be better tailored than they could be if a mixture of titanium oxide and cerium oxide was utilized alone.

Figure 5:
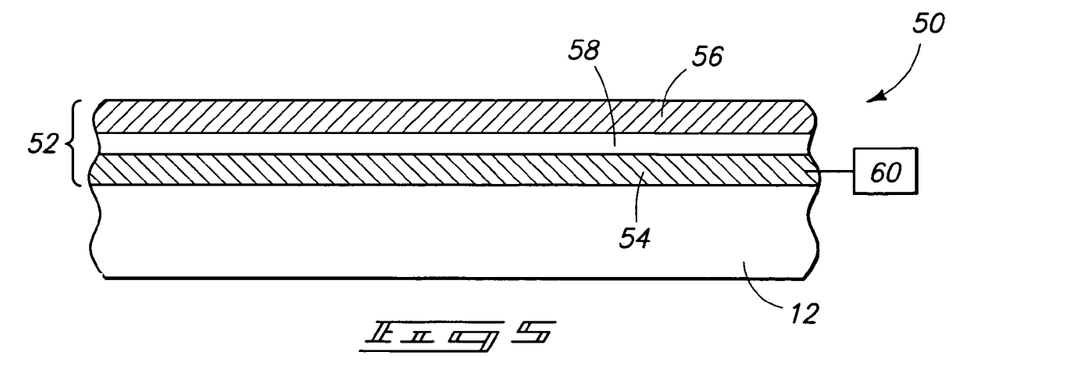
FIG. 5 is a diagrammatic, cross-sectional view of a semiconductor construction illustrating a capacitor formed in accordance with an aspect of the present invention.

The embodiments of FIGS. 5-7 are exemplary embodiments for utilization of dielectric materials of the present invention. It is to be understood that the mixed titanium oxide/cerium oxide dielectric materials can be utilized in other devices, or in other embodiments of the shown devices. For instance, the flash memory device of FIG. 7 can be a nitride read only memory (NROM) flash memory device in some aspects of the invention. In particular aspects of the invention, the dielectric materials of FIGS. 1-4 can be utilized in mixed signal integrated circuits, which are known in the art to be integrated circuits that process both analog and digital signals, such as, for example, disk drive read-channel integrated circuits.

Figure 8:
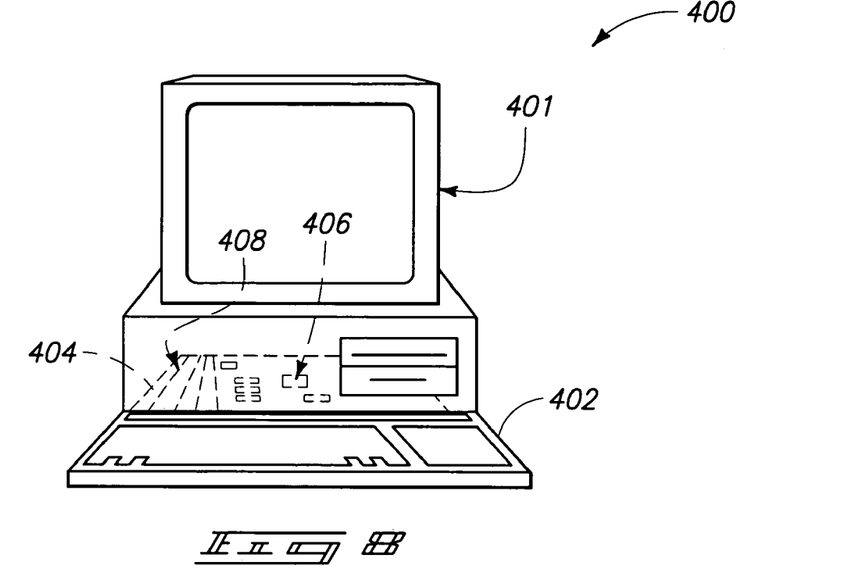
FIG. 8 is a diagrammatic view of a computer illustrating an exemplary application of the present invention.
Figure 9:
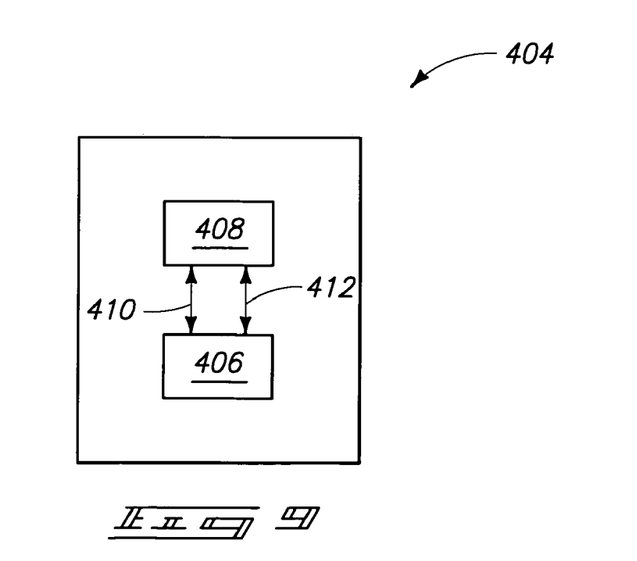
FIG. 9 is a block diagram showing particular features of the motherboard of the FIG. 8 computer.

FIG. 8 illustrates generally, by way of example but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 9. In such block diagram, the addressing circuitry is illustrated as 410 and the read circuitry is illustrated as 412. Various components of computer system 400, including processor 406, can comprise one or more of the dielectric materials described previously in this disclosure.

Processor device 406 can correspond to a processor module, and associated memory utilized with the module can comprise teachings of the present invention.

Memory device 408 can correspond to a memory module. For example, single in-line memory modules (SIMMs) and dual in-line memory modules (DIMMs) may be used in the implementation which utilize the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Memory device 408 can comprise constructions formed in accordance with one or more aspects of the present invention.

Figure 10:
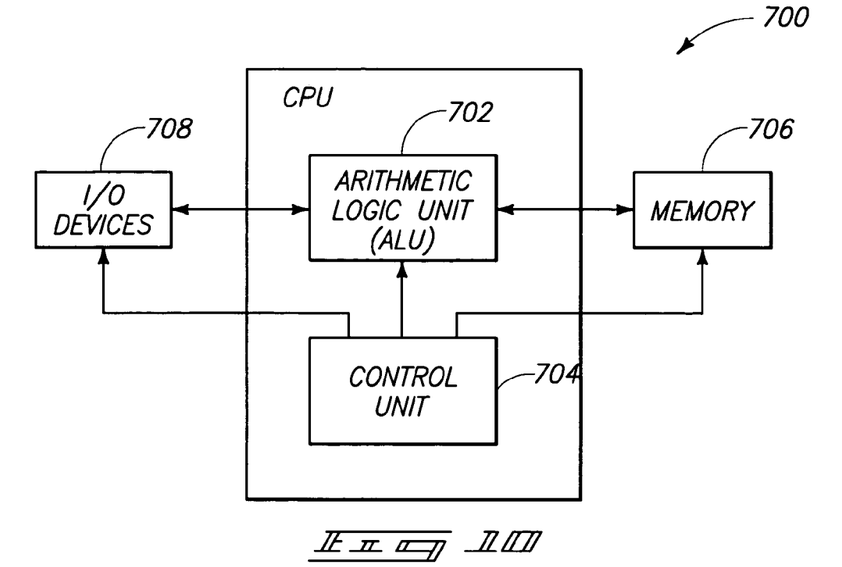
FIG. 10 is a high-level block diagram of an electronic system according to an exemplary aspect of the present invention.

FIG. 10 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include constructions in accordance with various aspects of the present invention.

Figure 11:
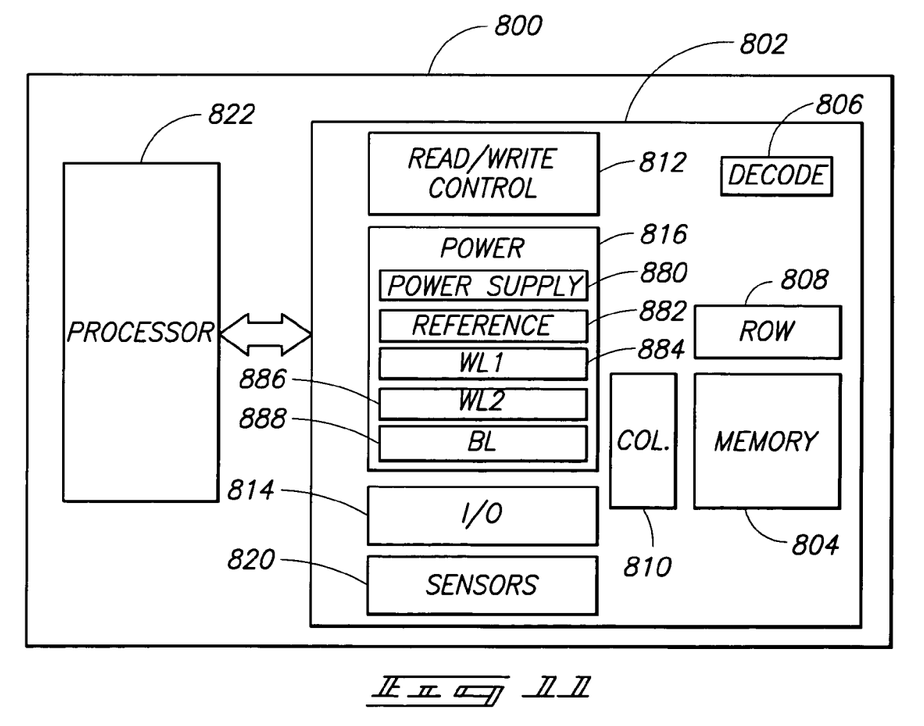
FIG. 11 is a simplified block diagram of an exemplary memory device according to an aspect of the present invention.

FIG. 11 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. The system 800 also includes a processor 822, or memory controller for memory accessing.

The memory device 802 receives control signals from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 can include one or more constructions of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of the ordinary skill in the art will understand that the various electronic systems can be fabricated in single-package processing units, or even on a single semiconductor chip, in order to reduce the communication time between the processor and the memory device (s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a semiconductor construction, comprising:
    providing a semiconductor substrate;
    providing a homogeneous mixture of $CeO_2$ and $TiO_2$ over the substrate; and
    atomic layer depositing a laminate dielectric material containing $CeO_2$ and $TiO_2$ over the homogeneous mixture.

2. A method of forming a semiconductor construction, comprising:
    providing a semiconductor substrate;
    atomic layer depositing a laminate dielectric material containing $CeO_2$ and $TiO_2$ over the substrate; and
    forming a homogeneous mixture of $CeO_2$ and $TiO_2$ over the laminate.

3. A method of forming a semiconductor construction, comprising:
    providing a semiconductor substrate;
    forming a first electrode of a capacitor over the substrate;
    forming a dielectric material over the first electrode; the forming the dielectric material comprising forming a homogenous mixture of $CeO_2$ and $TiO_2$, and comprising atomic layer depositing a laminate material containing $CeO_2$ and $TiO_2$;
    forming a second electrode of the capacitor over the dielectric material; and
    incorporating the capacitor into an analogue circuit.

4. A method of forming a semiconductor construction, comprising:
    providing a semiconductor substrate;
    forming a first electrode of a capacitor over the substrate;
    forming a dielectric material over the first electrode; the forming the dielectric material comprising forming a homogenous mixture of $CeO_2$, and $TiO_2$, and comprising atomic layer depositing a laminate material containing $CeO_2$ and $TiO_2$;
    forming a second electrode of the capacitor over the dielectric material; and
    incorporating the capacitor into a radio frequency circuit.

5. A method of forming a semiconductor construction, comprising:
    providing a semiconductor substrate;
    forming a first electrode of a capacitor over the substrate;
    forming a dielectric material over the first electrode; the forming the dielectric material comprising forming a homogenous mixture of $CeO_2$ and $TiO_2$, and comprising atomic layer depositing a laminate material containing $CeO_2$ and $TiO_2$;
    forming a second electrode of the capacitor over the dielectric material; and
    incorporating the capacitor into a mixed signal integrated circuit.

* * * * *